United States Patent [19]

Abe

[11] Patent Number: 4,970,587

[45] Date of Patent: Nov. 13, 1990

[54] ALIGNMENT TABLE FOR AUTOMATIC EXPOSING APPARATUS

[75] Inventor: Chiaki Abe, Tokyo, Japan

[73] Assignee: ORC Manufacturing Co., Tokyo, Japan

[21] Appl. No.: 430,263

[22] Filed: Nov. 2, 1989

[30] Foreign Application Priority Data

May 15, 1989 [JP] Japan ................................ 1-55500[U]

[51] Int. Cl.⁵ .............................................. H04N 7/18
[52] U.S. Cl. ...................................... 358/93; 358/101; 358/225
[58] Field of Search .................. 358/93, 101, 106, 107, 358/225

[56] References Cited

U.S. PATENT DOCUMENTS 4,342,090  7/1982  Caccoma .............................. 358/101

Primary Examiner—Howard W. Britton
Attorney, Agent, or Firm—Cushman, Darby & Cushman

[57] ABSTRACT

An improved alignment table employable for an automatic exposing apparatus used for producing a number of printed wiring boards, wherein the alignment table is designed in a flat and hollow box-shaped configuration comprising an upper plate, a lower plate and side plates, the upper plate and the lower plate are provided with transparent plates at positions located opposite to each other, respectively, and the upper surface of the transparent plate placed on the upper plate is provided in the form of a mat surface.

1 Claim, 5 Drawing Sheets

ALIGNMENT TABLE FOR AUTOMATIC EXPOSING APPARATUS

BACKGROUND OF THE INVENTION

1. Technical Field

The present invention relates generally to an alignment table used for automatically locating a work such as a copper-plated laminar plate serving as a base material for a printed wiring board at a predetermined position or for inspecting the work when it is laminated in a laminar structure. More particularly, the present invention relates to an alignment table for an automatic exposing apparatus which assures that figures taken by video cameras can be processed exactly.

2. Statement of the Related Art

When a pattern is formed on a copper-plated laminar plate serving as a base material for a printed wiring plate (hereinafter referred to as a work), the work is coated with solder after completion of a pattern formation or a plurality of works are integrally laminated one above another after completion of the pattern formation, it is required that the work is exactly located at a predetermined position. To meet the requirement, there have been heretofore made many proposals with respect to a method of locating a work in position. One of these proposals is disclosed in Japanese patent application No. 131,954/1988 (corresponding to U.S. Ser. No. 07/355,746 filed on May 23, 1989) which was filed by the common applicant to the present invention. To facilitate understanding of the present invention, the conventional automatic exposing apparatus will briefly be described below.

As shown in FIGS. 5 to 8, the conventional apparatus essentially comprises an aligning section 2 for determining the position of a work 1, an exposing section 3 in which the work 1 is exposed to light beam and a transferring section 4 for transferring the work 1 from the aligning section 2 to the exposing section 3. In detail, the aligning section 2 includes an alignment table designed in a hollow structure to hold the work 1 thereon, support rod 6 disposed below the alignment table 5, a motor drive mechanism 8 for rotating the alignment table 5 about the axis of the support rod 6 and displacing the alignment table 5 above a base 7 in the leftward/rightward direction (in the X-direction) as well as in the forward/rearward direction (Y-direction), a plurality of video cameras 13 for separately photographing via upper and lower transparent plates 9 and 10 attached to the alignment table 5 two or more position determining reference holes 12 (only one of them shown in the drawings) formed on the work 1, a position indexing unit 16 for deriving a central position 14a of each of figures taken by the video cameras 13 (see FIG. 7) by processing the respective figures and moreover calculating a central position 14 of the reference hole 12 by inputting the position of photographing of the video cameras 13 into the position indexing unit 16, a comparative determination unit 18 determining whether or not the work 1 has reached a predetermined position where the work 1 is correctly aligned with a exposing frame 17 when the work 1 is transferred to the exposing section 3 from the central position of the reference hole 12 calculated by the position indexing unit 16 and a drive control unit 19 for controlling the motor driving mechanism 8 so as to derive a satisfactory determination result. As is apparent from FIG. 3, the motor drive mechanism 8 comprises a X-coordinate drive mechanism 20, a Y-coordinate drive mechanism 22 and a THEATA drive mechanism 23.

In FIG. 5, reference numeral 15 designates a position adjusting mechanism for displacing the respective video cameras 13 to a region where photographing can be effected and for generating signals a indicative of positions of the video cameras 13. As shown in detail in FIG. 3, the position adjusting mechanism 15 comprises a X-coordinate drive mechanism 24 for displacing the video cameras 13 in the leftward/rightward direction, a Y-coordinate drive mechanism 25 for displacing the video cameras 13 in the forward/rearward direction and Z-coordinate drive mechanism 26 for displacing the video cameras 13 in the upward/downward direction.

In FIG. 5, reference numeral 28 designates an introduction handler for bringing an unexposed work 1 from an entry stocker 29, reference numeral 30 designates a traverser for transferring the work 1 located in position on the alignment table 5 to the exposing section 3, reference numeral 31 designates a taking-out handler for transferring the exposed work 1 to a taking-out stocker 32, reference numeral 33 designates an exposing lamp, reference numeral 34 designates a mirror and reference numeral 35 designate a suction duct. Further, in FIG. 6, reference numeral 36 designates a suction hole by way of which air is sucked so as to allow the work 1 to be brought in close contact with the upper surface of the alignment table 5.

With the conventional apparatus as constructed in the above described manner, after the work 1 is automatically located in position in the aligning section 2, it is exactly transferred to a predetermined position in the exposing section 3 by the traverser 30. Thus, the conventional apparatus offers advantageous features that it is possible to form a fine pattern and a number of products each having an excellent quality can be produced in a mass production line. However, it has been found from results derived from employment of the aforementioned position determining method that there is a need of improving the following items.

Alignment of a film with the work 2 in the exposing section 3 is carried out before the film is firmly held on the exposing frame 17. As shown in FIG. 6, the upper and lower surfaces of the work 1 including reference holes 12 (only one of them shown in the drawing) placed on the alignment table 5 are fully covered with dry films 38 (mask films), and each of the dry films 38 is curved inwardly in the reference hole 12 in a concave configuration.

Thus, light beam radiated from light sources 39 to reach a concave portion 40 causes a light collecting phenomenon under the effect of a light collecting function of the concave portion 40 (representing the function of a concave lens). This leads to a result that an isolated island-shaped bright spot 43 is generated in a FIG. 42 of the reference hole 12, as shown in FIG. 7. However, this bright spot 43 prevents a figure processing from being smoothly performed, whereby the central position 14 of each of the reference holes 12 is incorrectly detected by the video camera.

The same malfunction as described above takes place also during a solder plating step after completion of the pattern formation. During this step, of course, the lower surface of the work 1 is still not covered with a dry film. Since the upper and lower surfaces of the work 1 are covered with a copper foil having such an excellent surface flatness as given by a polishing operation so as to perform a soldering operation with easiness, reflected light coming from the lower peripheral portion of the reference hole causes a light collecting phenomenon. The collected light generates a plurality of bright spots 44 round the circumferential edge of a FIG. 42 of the reference hole 12. Similarly, the bright spots 44 prevent a figure processing from being performed smoothly.

Additionally, the same malfunction as described above takes place also during a step of placing a plurality of laminar plates each having a predetermined pattern formed thereon, one above another in a laminated structure. During this step, the central position of each of concave or convex recognition marks on the work is recognized but a high intensity of reflected light is generated along a part of the circumferential edge of the recognition mark. This causes bright spots to appear round the circumferential edge of a figure indicative of the recognition mark.

SUMMARY OF THE INVENTION

The present invention has been made with the foregoing background in mind and its object resides in providing an alignment table employable for an automatic exposing apparatus or the like which assures that a figure processing can reliably be performed for reference holes or recognition marks photographed by video cameras so as to exactly determine the position of a work.

To accomplish the above object, the present invention provides an alignment table for an automatic exposing apparatus or the like having a work such as a copper-plated laminar or the like plate placed thereon, the alignment table including a plurality of video cameras for photographing a plurality of position determining reference holes or recognition marks on the work via transparent plates placed on the alignment table and a position indexing unit for deriving the central position of a figure indicative of each of the reference holes or the recognition marks photographed by the video cameras by performing a figure processing so as to index the central position of each of the reference holes or the recognition marks while the positions of photographing of the video cameras are inputted into the position indexing unit, wherein the alignment table is designed in the form of a flat and hollow box-shaped configuration comprising an upper plate, a lower plate and side plates, the upper plate and the lower plate are provided with tow or more transparent plates at positions opposite to each other, respectively, and the upper surface of each of the transparent plates on the upper plate is provided in the form of a mat surface.

The alignment table as constructed in the above-described manner functions correctly while offering advantageous effects as noted hereinbelow.

(i) During a position determining step for forming a pattern, reflected light coming from the concave portion at the lower opening of a reference hole is radiated toward the mat surface and a large part of the reflected light is scattered from the mat surface to repeat scattering and reflecting between the mat surface and the concave portion. Consequently, an intensity of the reflected light is equalized and a part of the reflected light is absorbed in a dry film. Thus, no light collecting phenomenon occurs.

(ii) During a position determining step for forming a solder mask, reflected light coming from a polished copper film peripheral to the lower end of the reference hole is radiated toward the mat surface and scattered therefrom. As a result, no light collecting phenomenon occurs.

(iii) During an inspecting step for correctly aligning the center position of a recognition mark when placing a plurality of copper-plated laminar plates one above another in a laminar structure, reflected light coming from the circumferential edge of the recognition mark is radiated toward the mat surface and scattered therefrom.

(iv) Owing to the results as described in the preceding paragraphs (i), (ii) and (iii), no bright spot appears within a figure indicative of the recognition mark as well as round the circumferential edge of the figure.

(v) Owing to the results as described above in the preceding paragraph (iv), it becomes possible to smoothly processing the figure indicative of the recognition mark, whereby the central position of the figure can be detected exactly.

BRIEF DESCRIPTION OF THE DRAWINGS

The present invention is illustrated in the following drawings in which;

FIGS. 1 to 4 illustrate an alignment table for an automatic exposing apparatus or the like in accordance with an embodiment of the present invention, wherein FIG. 1 is a fragmentary sectional side view of the alignment table (i.e., a partially enlarged sectional view of the alignment table shown in FIG. 3), FIG. 2 is an explanatory sectional side view illustrating operation of the alignment table (i.e., an enlarged sectional view of a section II in FIG. 1), FIG. 3 is a schematic view of the alignment table, particularly illustrating an aligning section, and FIG. 4 is a plan view of the alignment table (i.e., a view as seen in the direction of IV marks in FIG. 3).

DESCRIPTION OF THE PREFERRED EMBODIMENT

Figure 1:
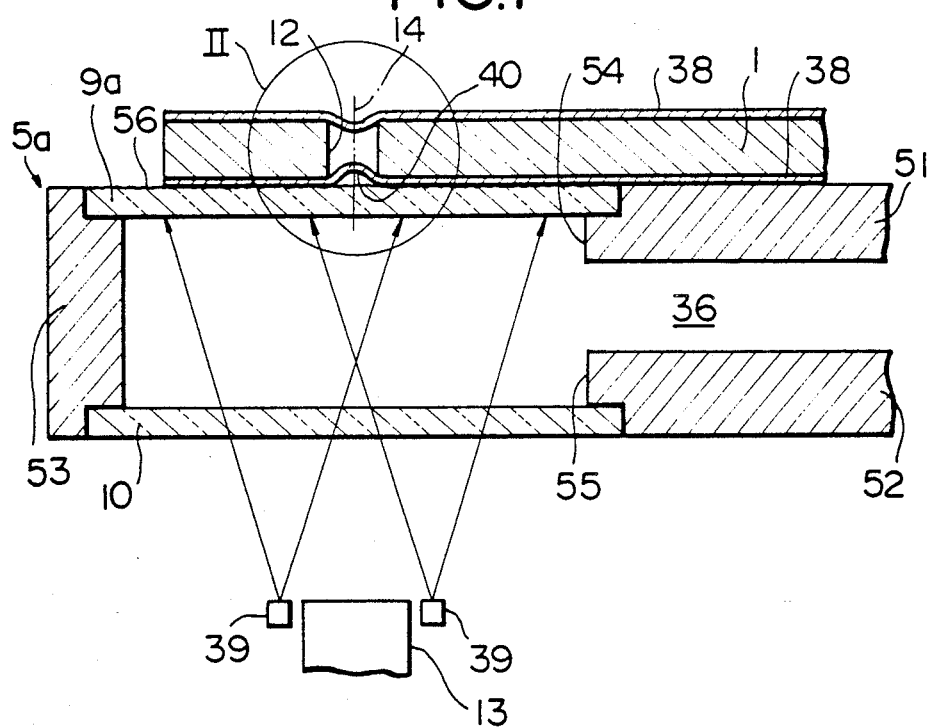

Now, the present invention will be described in detail hereinafter with reference to the accompanying drawings which illustrate a preferred embodiment thereof. It should be noted that same or similar components as those in the conventional automatic exposing apparatus which has been described above as a prior art are represented by same reference numerals, since they function in the same way. Accordingly, repeated description will be required.

Figure 2:
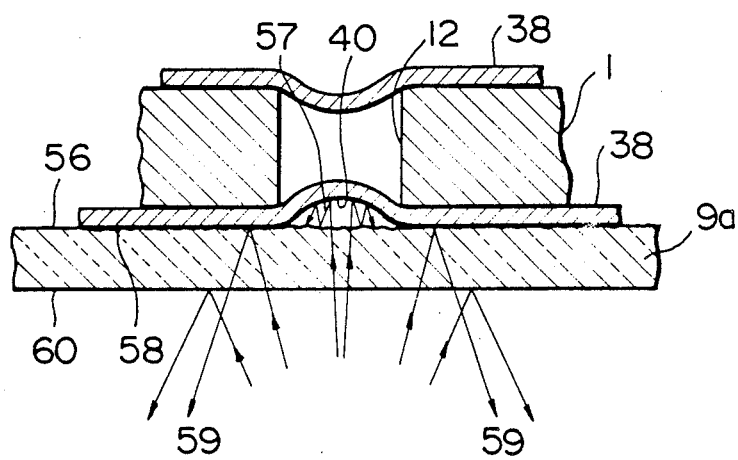
Figure 3:
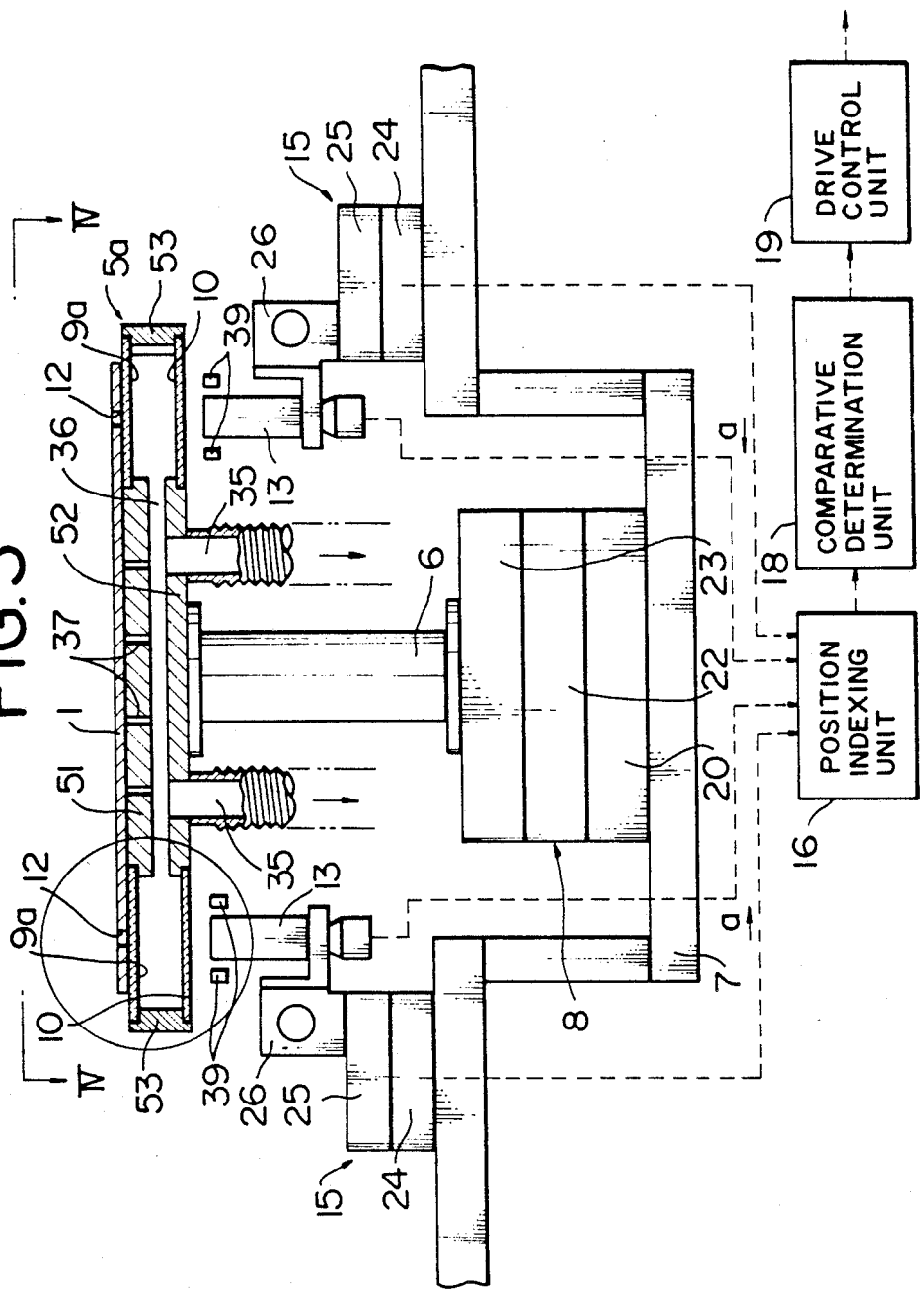
Figure 4:
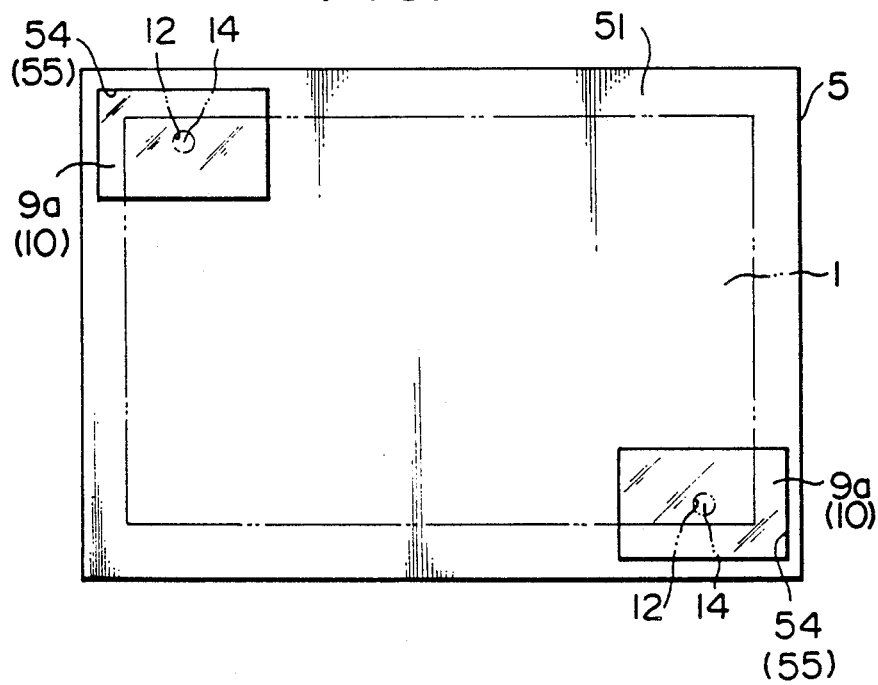
Figure 5:
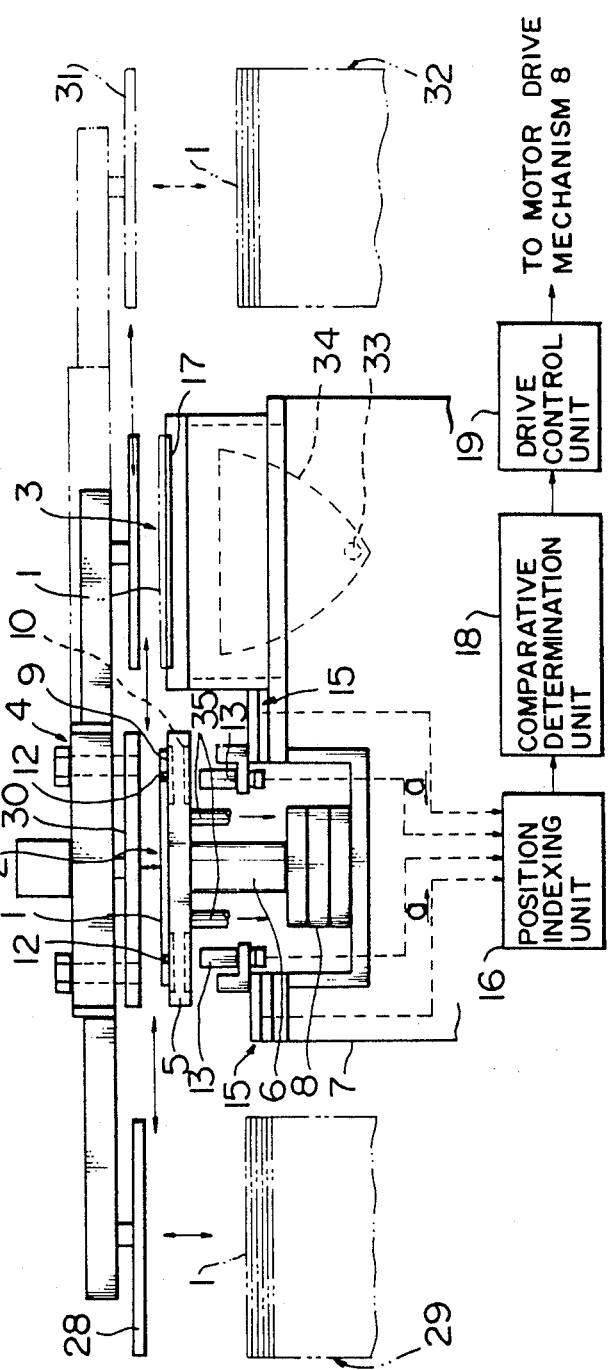
FIG. 5 is a schematic view illustrating arrangement of the automatic exposing apparatus.
Figure 6:
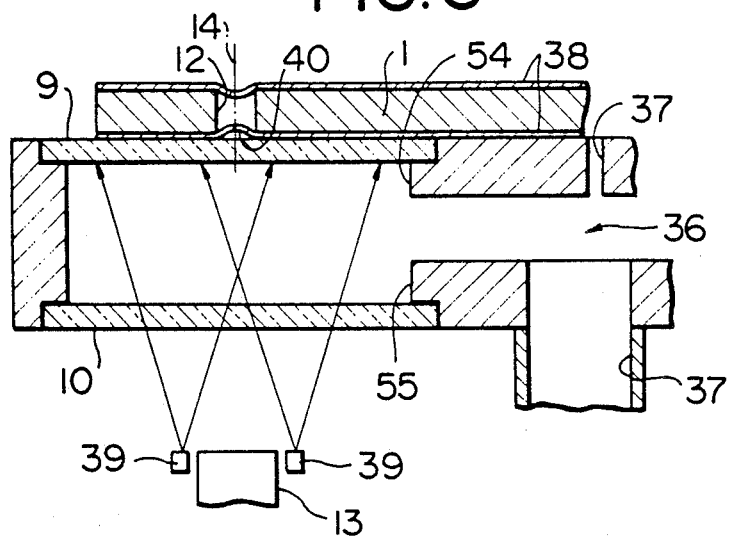
FIG. 6 is a fragmentary sectional side view illustrating the structure of a conventional alignment table.
Figure 7:
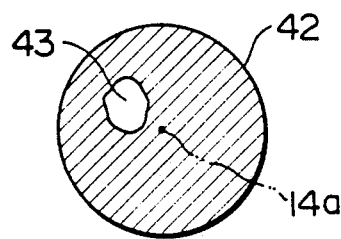
FIGS. 7 and 8 are an explanatory view illustrating the figure cf a reference hole derived with the use of the conventional alignment table, respectively.
Figure 8:
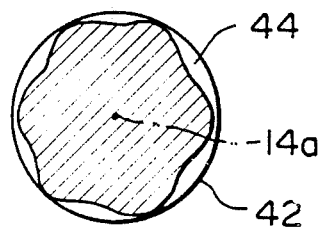

FIGS. 1 to 4 illustrate an alignment table for an automatic exposing apparatus or the like in accordance with the embodiment of the present invention. As is apparent from FIGS. 3 and 4, an alignment table 5a of the present invention is designed in the form of a flat and hollow box-shaped configuration comprising an upper plate 51, a lower plate 52 and side plates 53. The upper plate 51 and the lower plate 52 are formed with windows 54 and 55 each having predetermined dimensions at plural positions (at two positions in the shown embodiment) located opposite to each other. The windows 54 and 55 are fitted with transparent plates 9a and 10 made of glass, acrilic resin or ceramic material. As shown in FIGS. 1 and 2, the upper surface of the transparent plate 9a on the upper plate 51 is provided in the form of a frosted surface, i.e. a mat surface 56.

Next, operation of the alignment table 9a will be described below. As described already above with reference to the conventional alignment table, upper and lower surfaces of a work 1 are covered with a dry film 38, respectively, when the work 1 is correctly located at a position which has been determined for the purpose of forming a pattern.

When light beam is radiated from a pair of light sources 39 while the work 1 is held in the foregoing state, the dry film 38 on the lower surface of the work 1 is exposed to light beam via the transparent plates 9a and 10 and the reflected light is received by a video camera 13, as shown in FIG. 1. At this moment, a large part of the reflected light 57 (see FIG. 2) coming from the concave portion 40 covering a reference hole 12 (only one of two reference holes 12 shown in the drawing) is scattered along the mat surface 56 and the scattered light repeats reflecting and scattering within the space between the concave portion 40 and the mat surface 56 until an intensity of the reflected light is equalized finally. It should be noted that a part of the reflected light is absorbed in the dry film 39 (It has been found as results derived from a number of experiments that a reflectivity amounts to about 10%). Consequently, in contrast with the conventional alignment table, a light collecting phenomenon does not occur and a figure of the reference hole 12 does not exhibit a bright spot. A large part of the reflected light 59 coming from other portion 58 rather than the concave portion 40 is received by the video camera, because the dry film 38 comes in close contact with the mat surface 56 (It has been found from the results derived from the experiments that the mat surface 56 has a reflectivity of about 90% and the lower surface 60 of the transparent plate 9a has a reflectivity of about 100%). Thus, the resultant figure exhibits a clear contour, whereby a figure processing can smoothly be performed and the position of the reference hole 12 can be detected exactly.

The reflected light coming from the peripheral portion of the reference hole 12 creates an intense ring-shaped reflected light during a soldering step. However, since this reflected light is introduced in and scattered from the the mat surface 56 and then released upwardly through the upper opening of the reference hole 12 during a light collecting step, no bright spot appears round the circumferential edge of the figure indicative of the reference hole 12.

Additionally, since an intense reflected light generated round the edge portion of a recognition mark is scattered along the mat surface 56 during an inspecting step of forming a copper-plated laminar plate in a laminated structure, no bright spot appears round the circumferential edge portion of a figure indicative of the recognition mark.

Incidentally, the present invention should not be limited only to the above-described embodiment. Alternatively, transparent plates may be arranged at three or more locations on the alignment table. Further, instead of arrangement of the transparent plates at two corners located in the diagonal direction of a work, they may be arranged at the central part of the alignment table or at positions located in the proximity of the central part. It should of course be understood that various changes or modifications may be made without departure from the scope of the present invention as defined by the appended claim.

As will be readily apparent from the above description, the present invention offers the following advantageous effects.

(i) Since the transparent plate placed on the alignment table is provided in the form of a mat surface, reflected light coming from the reference hole or the peripheral portion of a reference hole or reflected light coming from the edge portion of a recognition mark can be scattered along the mat surface. As a result, a figure taken by a video camera does not exhibit any bright spot.

(ii) Owing to the result as described in the preceding paragraph, it becomes possible to perform a figure processing smoothly. Thus, the central position of the reference hole or the recognition mark can be detected exactly.

(iii) Owing to the result as described in the preceding paragraph (ii), an accuracy of determining the position of a work can be improved and moreover a quality of the resultant product can be increased.

What is claimed is:

1. In an alignment table employable for an automatic exposing apparatus or the like with a work such as a copper-plated laminar plate or the like placed on said alignment table, said alignment table including a plurality of video cameras for photographing one or more position determining reference holes or recognition marks on said work via transparent plates placed on the work and a position indexing unit for deriving the central position of a figure indicative of each of said reference holes or said recognition marks by processing figures of the reference holes or the recognition marks photographed by said video cameras by performing a figure processing so as to index the central position of each of said reference holes or said recognition marks while the positions of photographing of the video cameras are inputted into said position indexing unit, the improvement wherein;

the alignment table is designed in the form of a flat and hollow box-shaped configuration comprising an upper plate, a lower plate and side plates, said upper plate and said lower plate are provided with two or more transparent plates at positions located opposite to each other, respectively, and the upper surface of the transparent plate placed on the upper plate is provided in the form of a mat surface.

* * * * *